United States Patent
Jian

(10) Patent No.: US 11,894,043 B2
(45) Date of Patent: Feb. 6, 2024

(54) POWER MANAGEMENT CIRCUIT IN LOW-POWER DOUBLE DATA RATE MEMORY AND MANAGEMENT METHOD THEREOF

(71) Applicant: Integrated Silicon Solution Inc., Milpitas, CA (US)

(72) Inventor: Shuenrun Seara Jian, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 194 days.

(21) Appl. No.: 17/704,152

(22) Filed: Mar. 25, 2022

(65) Prior Publication Data

US 2023/0140988 A1    May 11, 2023

(30) Foreign Application Priority Data

Nov. 5, 2021 (TW) .................................. 110141428

(51) Int. Cl.

| G11C 5/14 | (2006.01) |
| G11C 11/4074 | (2006.01) |
| G05F 1/56 | (2006.01) |
| G11C 5/02 | (2006.01) |

(52) U.S. Cl.
CPC .......... *G11C 11/4074* (2013.01); *G11C 5/147* (2013.01); *G05F 1/56* (2013.01); *G11C 5/025* (2013.01); *G11C 2207/105* (2013.01)

(58) Field of Classification Search
CPC ..... G11C 11/4074; G11C 5/147; G11C 5/025; G11C 2207/105; G05F 1/56
See application file for complete search history.

(56) References Cited

U.S. PATENT DOCUMENTS

| 2014/0070876 | A1* | 3/2014 | Paillet ....................... G06F 1/26 |
| | | | 327/538 |
| 2016/0370847 | A1* | 12/2016 | Choi ....................... G11C 5/147 |
| 2022/0179437 | A1* | 6/2022 | Lee .......................... H02M 3/04 |
| 2022/0334604 | A1* | 10/2022 | Kim ....................... G09G 3/3225 |
| 2023/0176600 | A1* | 6/2023 | Jian .......................... G05F 1/59 |
| | | | 323/273 |
| 2023/0273166 | A1* | 8/2023 | Cocheteux ......... G01N 33/0098 |
| | | | 324/71.1 |

FOREIGN PATENT DOCUMENTS

CN            112115670 A    * 12/2020

* cited by examiner

*Primary Examiner* — Mushfique Siddique

(74) *Attorney, Agent, or Firm* — McClure, Qualey & Rodack, LLP

(57) ABSTRACT

A power management circuit in a low-power double data rate memory is configured to manage a plurality of power supplies memory according to a reference voltage. A low dropout regulator has a first transmitting terminal and a second transmitting terminal. The low dropout regulator adjusts a voltage difference between a first voltage and a second voltage according to the reference voltage. A power network structure is electrically connected to the low dropout regulator. A first power network circuit has a first connecting point, a grid shape and a first unit network space. A second power network circuit has a second connecting point, another grid shape and a second unit network space. The second connecting point is separated from the first connecting point by a distance. The distance is smaller than or equal to one of the first unit network space and the second unit network space.

20 Claims, 9 Drawing Sheets

POWER MANAGEMENT CIRCUIT IN LOW-POWER DOUBLE DATA RATE MEMORY AND MANAGEMENT METHOD THEREOF

RELATED APPLICATIONS

This application claims priority to Taiwan Application Serial Number 110141428, filed Nov. 5, 2021, which is herein incorporated by reference.

BACKGROUND

Technical Field

The present disclosure relates to a power management circuit in a memory and a management method thereof. More particularly, the present disclosure relates to a power management circuit in a low-power double data rate memory and a management method thereof.

Description of Related Art

In the specifications of a low-power double data rate 4 (LPDDR4) memory, a specific voltage (e.g., VDD1) is used as an external power supply to generate another specific voltage (e.g., VCSA). The voltage VCSA is smaller than the voltage VDD1. In the conventional technique, the line width of the power supply requires 22 um when the voltage VDD1 is used as the external power supply to generate the voltage VCSA (the position of the voltage VCSA and the position of the voltage VDD1 are separated by more than 5000 um), so that the resistance of the line of the power supply is smaller than or equal to 10 ohms. However, due to the excessively large line width of the power supply in the conventional technology, the circuit area is increased, and the speed is slowed down. In addition, when the LPDDR4 memory enters a standby mode, using the voltage VDD1 will still consume a certain amount of power and generate a certain amount of leakage current. Accordingly, a power management circuit in a low-power double data rate memory and a management method thereof having the features of reducing the line width of the power supply, saving the power consumption and reducing the leakage current are commercially desirable.

SUMMARY

According to one aspect of the present disclosure, a power management circuit in a low-power double data rate memory is configured to manage a plurality of power supplies of the low-power double data rate memory according to a reference voltage. The power management circuit in the low-power double data rate memory includes a low dropout regulator and a power network structure. The low dropout regulator has a first transmitting terminal and a second transmitting terminal. The first transmitting terminal is configured to transmit a first voltage of the power supplies. The second transmitting terminal is configured to transmit a second voltage of the power supplies, and the low dropout regulator adjusts a voltage difference between the first voltage and the second voltage according to the reference voltage. The power network structure is electrically connected to the low dropout regulator and includes a first power network circuit and a second power network circuit. The first power network circuit has a first connecting point electrically connected to the first transmitting terminal. The first power network circuit has a grid shape and a first unit network space. The second power network circuit has a second connecting point electrically connected to the second transmitting terminal. The second power network circuit has another grid shape and a second unit network space, and the second connecting point is separated from the first connecting point by a distance. The distance is smaller than or equal to one of the first unit network space and the second unit network space.

According to another aspect of the present disclosure, a power management circuit in a low-power double data rate memory is configured to manage a plurality of power supplies of the low-power double data rate memory according to a first reference voltage, a second reference voltage and a control signal. The power management circuit in the low-power double data rate memory includes a first low dropout regulator, a second low dropout regulator and a power network structure. The first low dropout regulator has a first transmitting terminal and a second transmitting terminal. The first transmitting terminal is configured to transmit a first voltage of the power supplies. The second transmitting terminal is configured to transmit a second voltage of the power supplies, and the first low dropout regulator adjusts a first voltage difference between the first voltage and the second voltage according to the first reference voltage. The second low dropout regulator has a third transmitting terminal, a fourth transmitting terminal and a fifth transmitting terminal. The third transmitting terminal is configured to transmit a third voltage of the power supplies. The fourth transmitting terminal is configured to transmit the first voltage of the power supplies. The fifth transmitting terminal is configured to transmit a fourth voltage of the power supplies. The second low dropout regulator adjusts a second voltage difference between the third voltage and the first voltage according to the second reference voltage and the control signal, and adjusts a third voltage difference between the fourth voltage and the first voltage according to the control signal. The power network structure is electrically connected to the first low dropout regulator and the second low dropout regulator and has a unit network space. The power network structure is electrically connected to the first transmitting terminal and the second transmitting terminal through a first connecting point and a second connecting point. The second connecting point is separated from the first connecting point by a distance, and the distance is smaller than or equal to the unit network space.

According to further another aspect of the present disclosure, a management method of a power management circuit in a low-power double data rate memory is configured to manage a plurality of power supplies of the low-power double data rate memory according to a reference voltage. The management method of the power management circuit in the low-power double data rate memory includes performing a voltage supplying step and a voltage regulating step. The voltage supplying step includes supplying a first voltage to a first power network circuit of a power network structure and a low dropout regulator. The voltage regulating step includes configuring the low dropout regulator to generate a second voltage according to the first voltage and adjust a first voltage difference between the first voltage of a first transmitting terminal and the second voltage of a second transmitting terminal according to the reference voltage. The low dropout regulator has the first transmitting terminal and the second transmitting terminal. The first transmitting terminal is configured to transmit the first voltage of the power supplies. The second transmitting terminal is configured to transmit the second voltage of the power supplies. The power network structure is electrically connected to the low dropout regulator and includes the first power network circuit and a second power network circuit. The first power network circuit has a first connecting point electrically connected to the first transmitting terminal. The first power network circuit has a grid shape and a first unit network space. The second power network circuit has a second connecting point electrically connected to the second transmitting terminal. The second power network circuit has another grid shape and a second unit network space. The second connecting point is separated from the first connecting point by a distance, and the distance is smaller than or equal to one of the first unit network space and the second unit network space.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiments, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
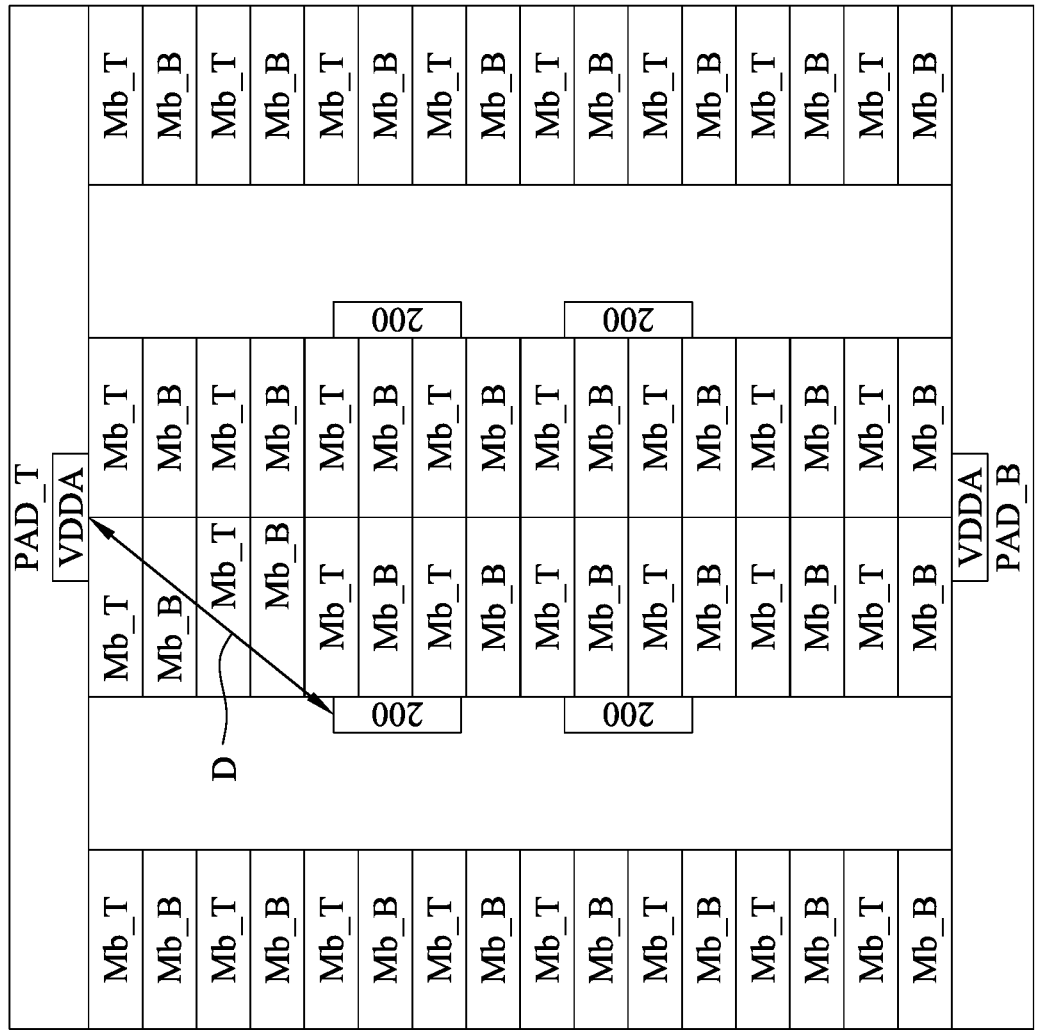
FIG. 1 shows a schematic view of a power management circuit in a low-power double data rate memory according to a first embodiment of the present disclosure.
Figure 2:
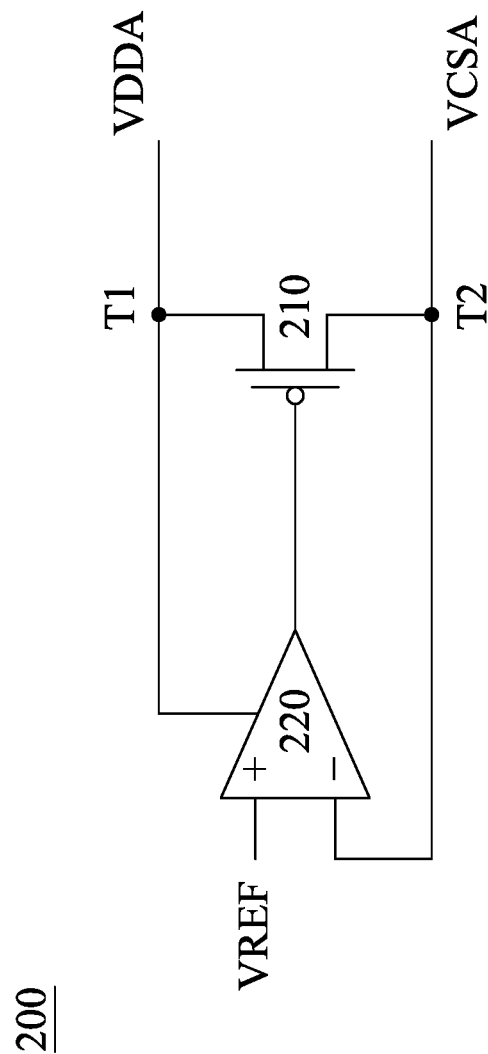
FIG. 2 shows a schematic view of a low dropout regulator of the power management circuit in the low-power double data rate memory of FIG. 1.
Figure 3:
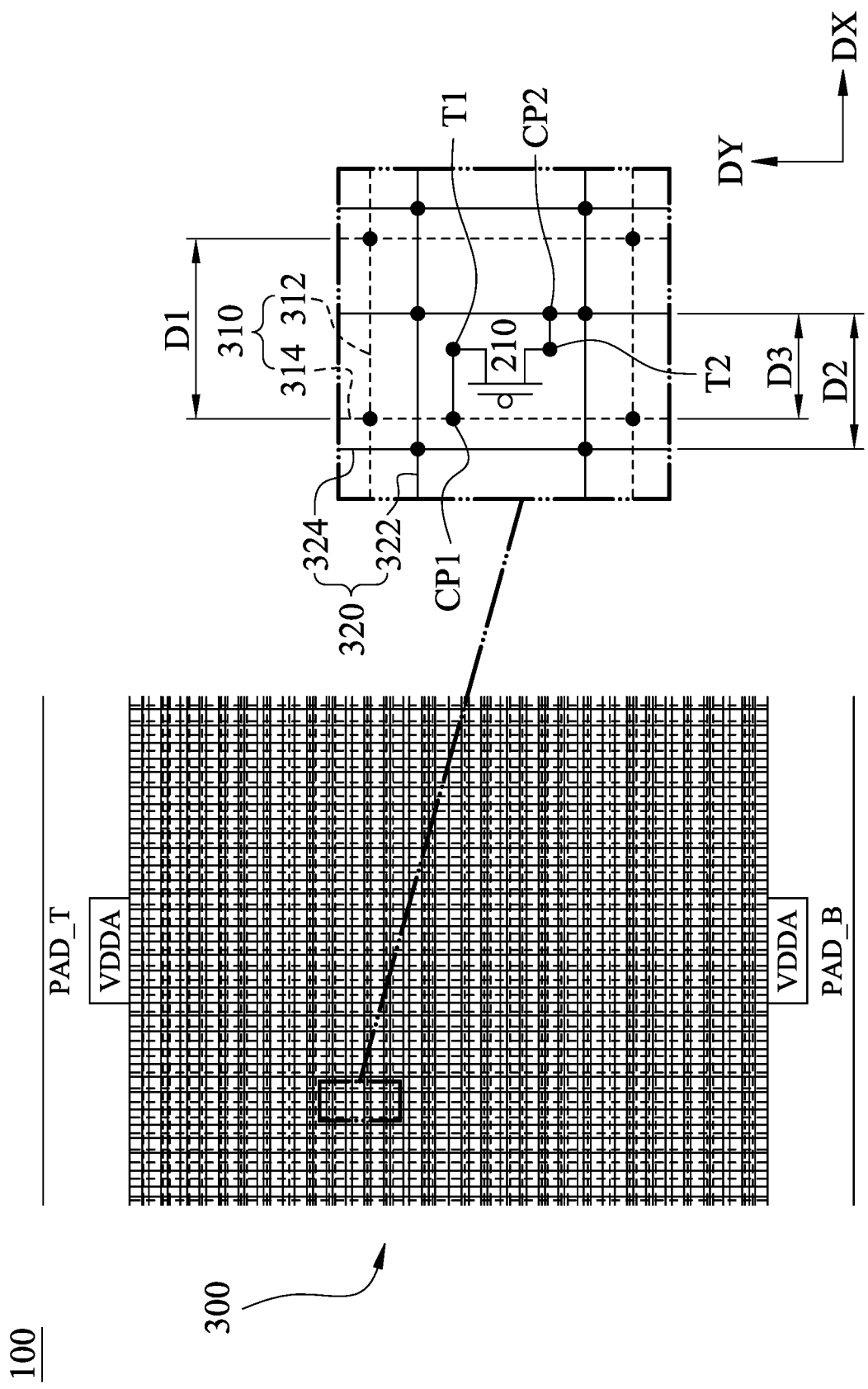
FIG. 3 shows a schematic view of a power network structure of the power management circuit in the low-power double data rate memory of FIG. 1.
Figure 7:
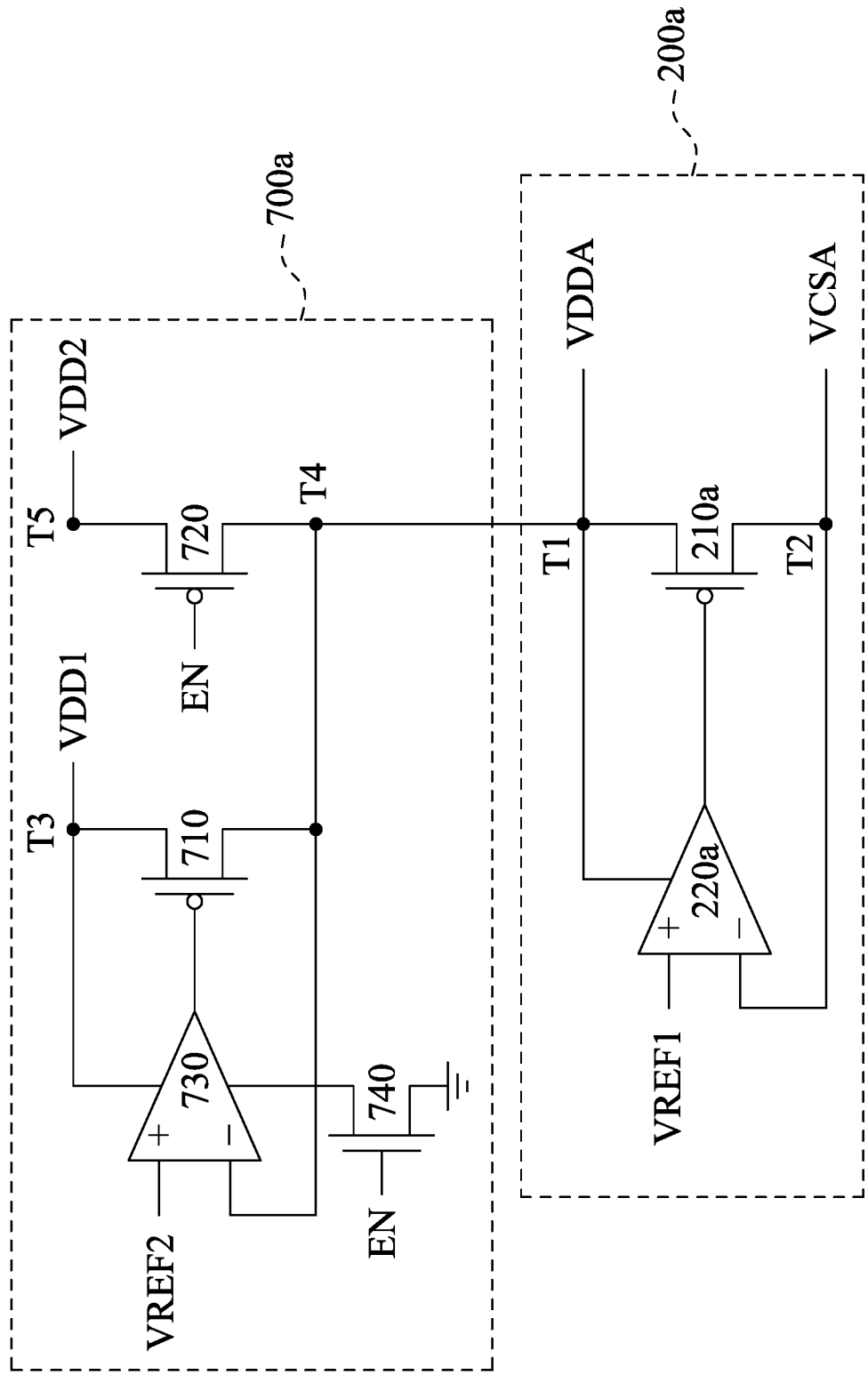
FIG. 7 shows a schematic view of a first low dropout regulator and a second low dropout regulator of the power management circuit in the low-power double data rate memory of FIG. 6.

Please refer to FIGS. 1, 2 and 3. FIG. 1 shows a schematic view of a power management circuit 100 in a low-power double data rate memory according to a first embodiment of the present disclosure. FIG. 2 shows a schematic view of a low dropout (LDO) regulator 200 of the power management circuit 100 in the low-power double data rate memory of FIG. 1. FIG. 3 shows a schematic view of a power network structure 300 of the power management circuit 100 in the low-power double data rate memory of FIG. 1. The power management circuit 100 in the low-power double data rate memory is configured to manage a plurality of power supplies of the low-power double data rate memory according to a reference voltage VREF. The power management circuit 100 in the low-power double data rate memory includes a low dropout regulator 200 and a power network structure 300. The low dropout regulator 200 has a first transmitting terminal T1 and a second transmitting terminal T2. The first transmitting terminal T1 is configured to transmit a first voltage VDDA of the power supplies. The second transmitting terminal T2 is configured to transmit a second voltage VCSA of the power supplies, and the low dropout regulator 200 adjusts a voltage difference between the first voltage VDDA and the second voltage VCSA according to the reference voltage VREF. In addition, the power network structure 300 is electrically connected to the low dropout regulator 200 and includes a first power network circuit 310 and a second power network circuit 320. The first power network circuit 310 has a first connecting point CP1 electrically connected to the first transmitting terminal T1. The first power network circuit 310 has a grid shape and a first unit network space D1. The second power network circuit 320 has a second connecting point CP2 electrically connected to the second transmitting terminal T2. The second power network circuit 320 has another grid shape and a second unit network space D2, and the second connecting point CP2 is separated from the first connecting point CP1 by a distance D3. The distance D3 is smaller than or equal to one of the first unit network space D1 and the second unit network space D2. Therefore, the power management circuit 100 in the low-power double data rate memory of the present disclosure utilizes the low dropout regulator 200 combined with the power network structure 300 and uses the first voltage VDDA as an external power supply to generate the second voltage VCSA, so that the line width of the power supply only requires 4 um to solve the problem of the conventional technology (e.g., using a third voltage VDD1 (as shown in FIG. 7) as the external power supply to generate the second voltage VCSA) that the line width of the power supply requires 22 um and is too large.

Figure 4:
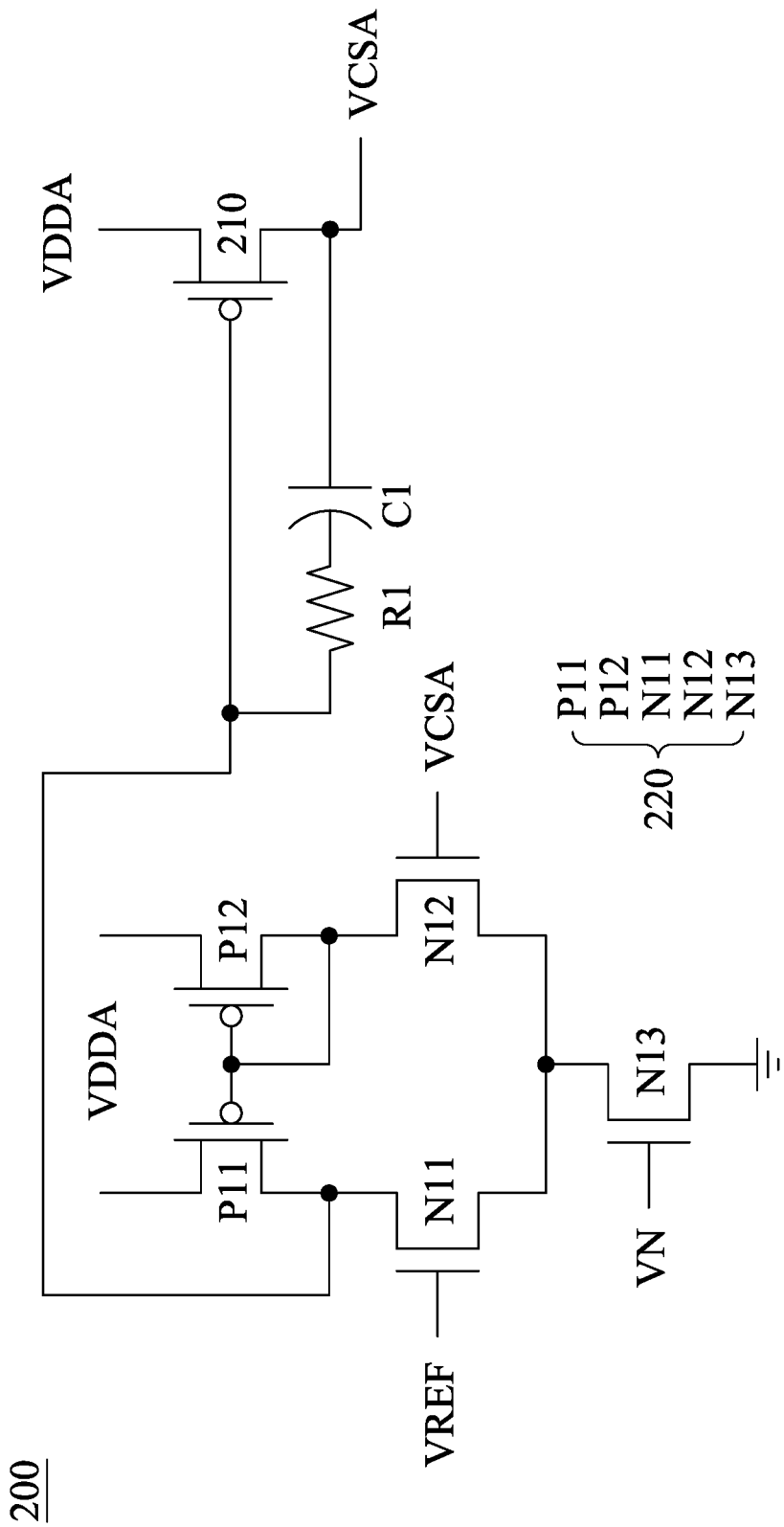
FIG. 4 shows a circuit diagram of the low dropout regulator of FIG. 2.
Figure 5:
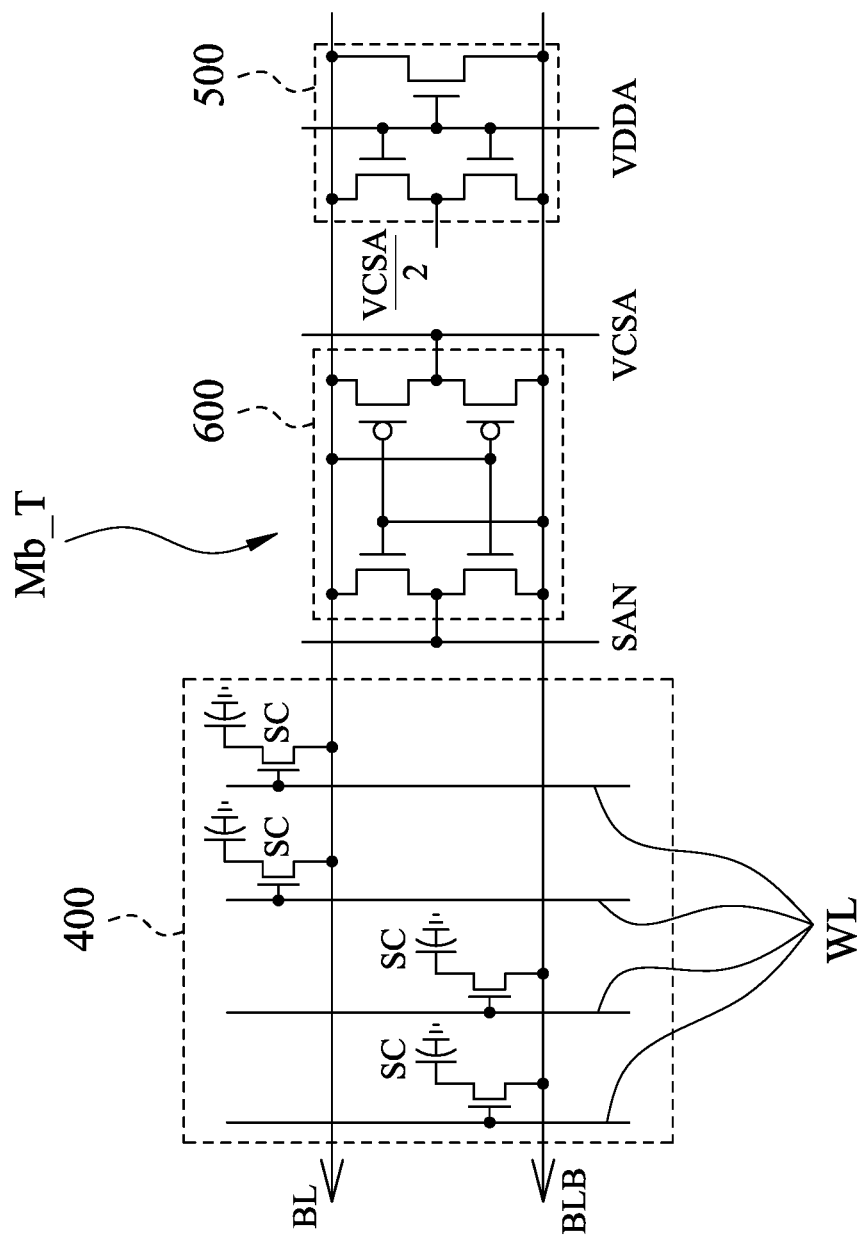
FIG. 5 shows a schematic view of a memory unit of the power management circuit in the low-power double data rate memory of FIG. 1.

Please refer to FIGS. 1, 2, 3, 4 and 5. FIG. 4 shows a circuit diagram of the low dropout regulator 200 of FIG. 2. FIG. 5 shows a schematic view of a memory unit Mb_T of the power management circuit 100 in the low-power double data rate memory of FIG. 1. The low-power double data rate memory may be a low-power double data rate 4 (LPDDR4) memory. The power management circuit 100 in the low-power double data rate memory includes a plurality of pads PAD_T, PAD_B, the low dropout regulator 200, the power network structure 300 and a plurality of memory units Mb_T, Mb_B.

The pads PAD_T, PAD_B are electrically connected to the power network structure 300 and supply the first voltage VDDA to the low dropout regulator 200, the power network structure 300 and the memory units Mb_T, Mb_B. The pad PAD_T supplies the first voltage VDDA to the memory unit Mb_T. The pad PAD_B supplies the first voltage VDDA to the memory unit Mb_B.

The low dropout regulator 200 includes a transistor 210 and a comparator 220. The transistor 210 is electrically connected between the first transmitting terminal T1 and the second transmitting terminal T2. The comparator 220 is electrically connected to the first transmitting terminal T1, the second transmitting terminal T2 and the transistor 210. The comparator 220 is configured to compare the reference voltage VREF and the second voltage VCSA to generate a comparison signal, and the comparison signal is electrically connected to the transistor 210 to adjust the voltage difference between the first voltage VDDA and the second voltage VCSA. The transistor 210 is a PMOS transistor and has a source electrode, a gate electrode and a drain electrode, and the source electrode, the gate electrode and the drain electrode are electrically connected to the first voltage VDDA, the comparison signal and the second voltage VCSA, respectively. In one embodiment, the first voltage is equal to 1.35 V, and the second voltage is equal to 0.94 V, but the present disclosure is not limited thereto. In addition, the low dropout regulator 200 further includes a resistor R1 and a capacitor C1. The resistor R1 and the capacitor C1 are electrically connected between the gate electrode and the drain electrode of the transistor 210. The comparator 220 includes a plurality of transistors P11, P12, N11, N12, N13. The transistor N11 is electrically connected between the transistor P11 and the transistor N13. The transistor N12 is electrically connected between the transistor P12 and the transistor N13, and the transistors P11, P12 are connected to each other. The transistors N11, N12, N13 are controlled by the reference voltage VREF, the second voltage VCSA and a bias voltage VN, respectively. Each of the transistors P11, P12 is the PMOS transistor, and each of the transistors N11, N12, N13 is an NMOS transistor.

The power network structure 300 includes the first power network circuit 310 and the second power network circuit 320. The first power network circuit 310 includes a plurality of first horizontal power lines 312 and a plurality of first vertical power lines 314. The first horizontal power lines 312 are arranged parallel to each other and extend in a first direction DX. The first vertical power lines 314 are arranged parallel to each other and extend in a second direction DY. Each of the first vertical power lines 314 is connected to each of the first horizontal power lines 312, and the second direction DY is perpendicular to the first direction DX. In addition, the second power network circuit 320 includes a plurality of second horizontal power lines 322 and a plurality of second vertical power lines 324. The second horizontal power lines 322 are arranged parallel to each other and extend in the first direction DX. The second vertical power lines 324 are arranged parallel to each other and extend in the second direction DY. Each of the second vertical power lines 324 is connected to each of the second horizontal power lines 322. The second connecting point CP2 is separated from the first connecting point CP1 by the distance D3 along one of the first direction DX and the second direction DY. In FIG. 3, the second connecting point CP2 is separated from the first connecting point CP1 by the distance D3 along the first direction DX.

The low dropout regulator 200 and the power network structure 300 are both disposed in a chip. The chip is made of complementary metal oxide semiconductor (CMOS) and includes a first metal layer and a second metal layer. The first power network circuit 310 and the second power network circuit 320 are located in the first metal layer and the second metal layer, respectively.

The memory unit Mb_T includes a storage unit 400, a voltage equalization circuit 500 and a sensing circuit 600. The storage unit 400 includes a bit line BL, a bit line bar BLB, at least one storage capacitor SC and at least one word line WL. The at least one storage capacitor SC is connected to the at least one word line WL and one of the bit line BL and the bit line bar BLB. The at least one storage capacitor SC is configured to store a storage message. The voltage equalization circuit 500 is electrically connected to the bit line BL, the bit line bar BLB, the first voltage VDDA and an equalization reference voltage (i.e., VCSA/2). The voltage equalization circuit 500 is configured to equalize the bit line BL and the bit line bar BLB according to the first voltage VDDA. The sensing circuit 600 is electrically connected to the bit line BL, the bit line bar BLB, the second voltage VCSA and an inverted voltage SAN. The sensing circuit 600 is configured to sense a storage message of the storage capacitor SC according to the second voltage VCSA and transmit the storage message to one of the bit line BL and the bit line bar BLB. The voltage equalization circuit 500 is adjacent to the sensing circuit 600, i.e., a load terminal of the first voltage VDDA is adjacent to a load terminal of the second voltage VCSA. The detail of internal structures and read-write operations of the storage unit 400, the voltage equalization circuit 500 and the sensing circuit 600 is known in the prior art. The structure of the memory unit Mb_B is the same as the structure of the memory unit Mb_T, and will not be described again herein.

Therefore, the power management circuit 100 in the low-power double data rate memory of the present disclosure utilizes the low dropout regulator 200 combined with the power network structure 300 and uses the first voltage VDDA as an external power supply to generate the second voltage VCSA, so that the line width of the power supply only requires 4 um to solve the problem of the conventional technology (e.g., using a third voltage VDD1 (as shown in FIG. 7) as the external power supply to generate the second voltage VCSA) that the line width of the power supply requires 22 um and is too large. In the LPDDR4 memory, the external power supply is inputted from the pads PAD_T, PAD_B. Take the pad PAD_T for example, because the line transmitting the third voltage VDD1 does not have the grid shape, the line transmitting the third voltage VDD1 (corresponding to the position of the first voltage VDDA in FIG. 1) is separated from the low dropout regulator 200 by a distance D. The distance D is equal to 5000 um, and the line width of the power supply requires 22 um. However, in the present disclosure, the first voltage VDDA is used as the external power supply instead of the third voltage VDD1, and the line transmitting the first voltage VDDA (i.e., the first power network circuit 310) has the grid shape, so that the distance between the first power network circuit 310 and the low dropout regulator 200 can be greatly shortened, and the line width of the power supply only requires 4 um. In addition, the load terminal of the first voltage VDDA (e.g., the voltage equalization circuit 500) is adjacent to the load terminal of the second voltage VCSA (e.g., the sensing circuit 600). The structure of the first power network circuit 310 and the second power network circuit 320 can greatly shorten the distance between the first connecting point CP1 and the second connecting point CP2, thereby saving the line width of the power supply by 81%.

Figure 6:
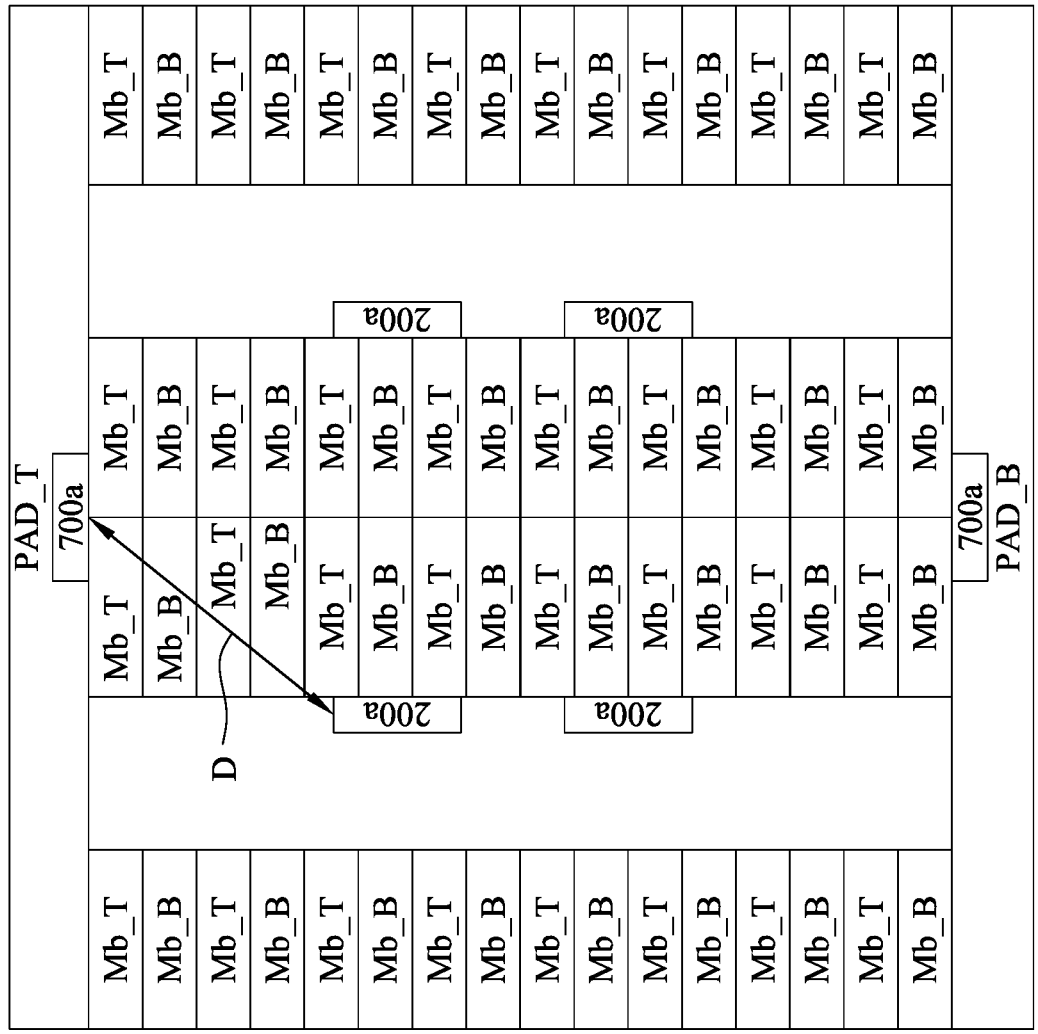
FIG. 6 shows a schematic view of a power management circuit in a low-power double data rate memory according to a second embodiment of the present disclosure.

Please refer to FIGS. 3, 6 and 7. FIG. 6 shows a schematic view of a power management circuit 100a in a low-power double data rate memory according to a second embodiment of the present disclosure. FIG. 7 shows a schematic view of a first low dropout regulator 200a and a second low dropout regulator 700a of the power management circuit 100a in the low-power double data rate memory of FIG. 6. The power management circuit 100a in the low-power double data rate memory is configured to manage a plurality of power supplies of the low-power double data rate memory according to a first reference voltage VREF1, a second reference voltage VREF2 and a control signal EN. The power management circuit 100a in the low-power double data rate memory includes the first low dropout regulator 200a, the second low dropout regulator 700a and a power network structure 300. The first low dropout regulator 200a has a first transmitting terminal T1 and a second transmitting terminal T2. The first transmitting terminal T1 is configured to transmit a first voltage VDDA of the power supplies. The second transmitting terminal T2 is configured to transmit a second voltage VCSA of the power supplies, and the first low dropout regulator 200a adjusts a first voltage difference between the first voltage VDDA and the second voltage VCSA according to the first reference voltage VREF1. Moreover, the second low dropout regulator 700a has a third transmitting terminal T3, a fourth transmitting terminal T4 and a fifth transmitting terminal T5. The third transmitting terminal T3 is configured to transmit a third voltage VDD1 of the power supplies. The fourth transmitting terminal T4 is configured to transmit the first voltage VDDA of the power supplies. The fifth transmitting terminal T5 is configured to transmit a fourth voltage VDD2 of the power supplies. The second low dropout regulator 700a adjusts a second voltage difference between the third voltage VDD1 and the first voltage VDDA according to the second reference voltage VREF2 and the control signal EN, and adjusts a third voltage difference between the fourth voltage VDD2 and the first voltage VDDA according to the control signal EN. The power network structure 300 is electrically connected to the first low dropout regulator 200a and the second low dropout regulator 700a and has a unit network space. The power network structure 300 is electrically connected to the first transmitting terminal T1 and the second transmitting terminal T2 through a first connecting point CP1 and a second connecting point CP2. The second connecting point CP2 is separated from the first connecting point CP1 by a distance D3, and the distance D3 is smaller than or equal to the unit network space. The unit network space is equal to one of the first unit network space D1 and the second unit network space D2 of FIG. 3. Therefore, the power management circuit 100a in the low-power double data rate memory of the present disclosure can utilize the control signal EN to switch the operation of the second low dropout regulator 700a in the standby mode and short circuit the first voltage VDDA and the fourth voltage VDD2, thus reducing the first voltage VDDA and the second voltage VCSA. In other words, the present disclosure can not only greatly save the power consumption of the third voltage VDD1, but also effectively reduce the leakage current of the circuit.

Figure 8:
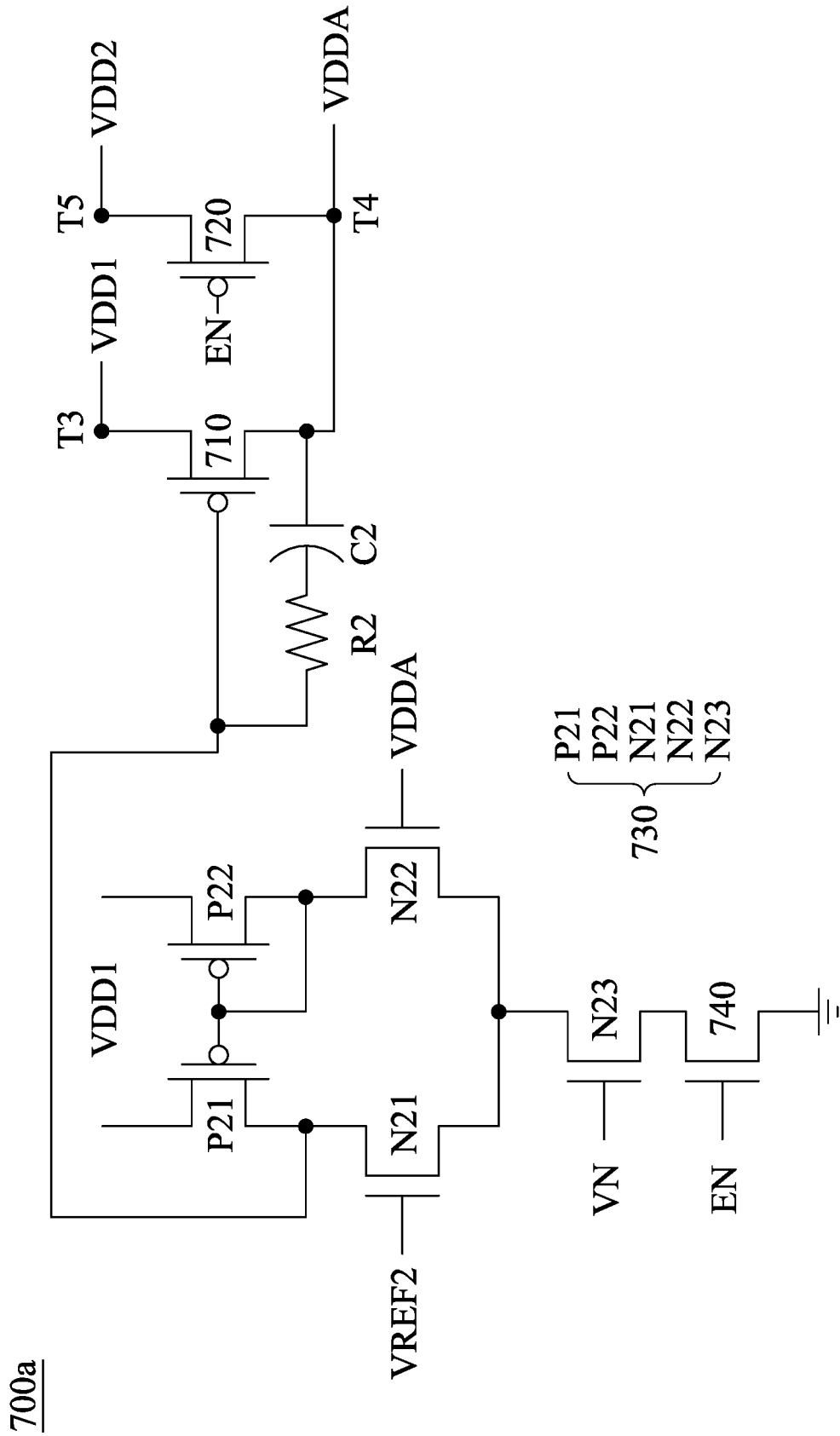
FIG. 8 shows a circuit diagram of the second low dropout regulator of FIG. 7.

Please refer to FIGS. 2, 6, 7 and 8. FIG. 8 shows a circuit diagram of the second low dropout regulator 700a of FIG. 7. The low-power double data rate memory may be a LPDDR4 memory. The first low dropout regulator 200a includes a first transistor 210a and a first comparator 220a. The first transistor 210a and the first comparator 220a are the same as the transistor 210 and the comparator 220 of the low dropout regulator 200 in FIG. 2, respectively. The second low dropout regulator 700a includes a second transistor 710, a third transistor 720, a second comparator 730 and a fourth transistor 740. The second transistor 710 is electrically connected between the third transmitting terminal T3 and the fourth transmitting terminal T4. The third transistor 720 is electrically connected between the fourth transmitting terminal T4 and the fifth transmitting terminal T5 and controlled by the control signal EN. The second comparator 730 is electrically connected to the third transmitting terminal T3, the fourth transmitting terminal T4 and the second transistor 710. The second comparator 730 is configured to compare the second reference voltage VREF2 and the first voltage VDDA to generate a second comparison signal, and the second comparison signal is electrically connected to the second transistor 710 to adjust the second voltage difference between the third voltage VDD1 and the first voltage VDDA. The fourth transistor 740 is electrically connected to the second comparator 730 and controlled by the control signal EN. Each of the second transistor 710 and the third transistor 720 is a PMOS transistor, and the fourth transistor 740 is an NMOS transistor. In the specifications of the LPDDR4 memory, the range of the third voltage VDD1 is from 1.70 V to 1.95 V, and the range of the fourth voltage VDD2 is from 1.06 V to 1.17 V. In one embodiment of the present disclosure, the first voltage VDDA is equal to 1.35 V, and the second voltage VCSA is equal to 0.94 V. The third voltage VDD1 is equal to 1.80 V, and the fourth voltage VDD2 is equal to 1.10 V, but the present disclosure is not limited thereto. In addition, the second low dropout regulator 700a further includes a resistor R2 and a capacitor C2. The resistor R2 and the capacitor C2 are electrically connected between the gate electrode and the drain electrode of the second transistor 710. The second comparator 730 includes a plurality of transistors P21, P22, N21, N22, N23. The transistor N21 is electrically connected between the transistor P21 and the transistor N23. The transistor N22 is electrically connected between the transistor P22 and the transistor N23, and the transistors P21, P22 are connected to each other. The transistors N21, N22, N23 are controlled by the second reference voltage VREF2, the first voltage VDDA and a bias voltage VN, respectively. Each of the transistors P21, P22 is the PMOS transistor, and each of the transistors N21, N22, N23 is the NMOS transistor.

The first low dropout regulator 200a, the second low dropout regulator 700a and the power network structure 300 are all disposed in a chip. The chip is made of CMOS and includes a first metal layer and a second metal layer. The first power network circuit 310 and the second power network circuit 320 are located in the first metal layer and the second metal layer, respectively. The power network structure 300 and the memory units Mb_T, Mb_B are the same as the power network structure 300 and the memory units Mb_T, Mb_B of the power management circuit 100 in the low-power double data rate memory of FIGS. 3 and 1, respectively. Therefore, the power management circuit 100a in the low-power double data rate memory of the present disclosure can utilize the control signal EN to switch the operation of the second low dropout regulator 700a in the standby mode and short circuit the first voltage VDDA and the fourth voltage VDD2, thus reducing the first voltage VDDA and the second voltage VCSA. In other words, the present disclosure can not only greatly save the power consumption of the third voltage VDD1, but also effectively reduce the leakage current of the circuit.

Figure 9:
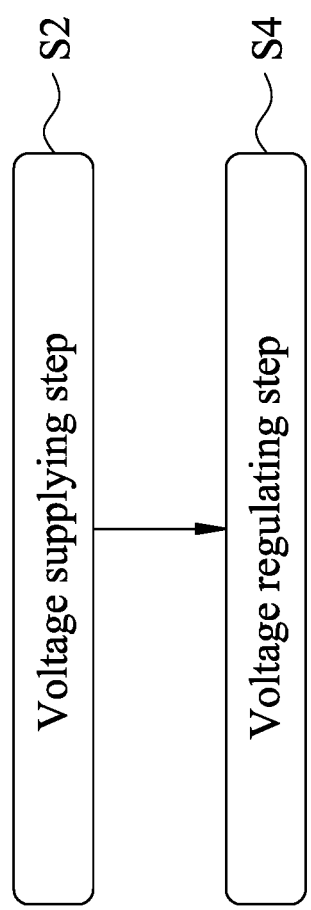
FIG. 9 shows a flow chart of a management method of a power management circuit in a low-power double data rate memory according to a third embodiment of the present disclosure.

Please refer to FIGS. 1, 2, 3 and 9. FIG. 9 shows a flow chart of a management method 800 of a power management circuit 100 in a low-power double data rate memory according to a third embodiment of the present disclosure. The management method 800 may be applied to the power management circuit 100 in the low-power double data rate memory of FIG. 1. The management method 800 of the power management circuit 100 in the low-power double data rate memory is configured to manage a plurality of power supplies of the low-power double data rate memory according to a reference voltage VREF. The management method 800 of the power management circuit 100 in the low-power double data rate memory includes performing a voltage supplying step S2 and a voltage regulating step S4. The voltage supplying step S2 includes supplying a first voltage VDDA to a first power network circuit 310 of a power network structure 300 and a low dropout regulator 200. The voltage regulating step S4 includes configuring the low dropout regulator 200 to generate a second voltage VCSA according to the first voltage VDDA and adjust a first voltage difference between the first voltage VDDA of a first transmitting terminal T1 and the second voltage VCSA of a second transmitting terminal T2 according to the reference voltage VREF. Therefore, the management method 800 of the power management circuit 100 in the low-power double data rate memory of the present disclosure utilizes the low dropout regulator 200 combined with the power network structure 300 and uses the first voltage VDDA as an external power supply to generate the second voltage VCSA, so that the line width of the power supply only requires 4 um to solve the problem of the conventional technology (e.g., using a third voltage VDD1 as the external power supply to generate the second voltage VCSA) that the line width of the power supply requires 22 um and is too large.

Please refer to FIGS. 3, 6, 7 and 9. The management method 800 of FIG. 9 may be applied to the power management circuit 100a in the low-power double data rate memory of FIG. 6. The management method 800 of the power management circuit 100a in the low-power double data rate memory is configured to manage a plurality of power supplies of the low-power double data rate memory according to a first reference voltage VREF1, a second reference voltage VREF2 and a control signal EN. The management method 800 of the power management circuit 100a in the low-power double data rate memory includes performing a voltage supplying step S2 and a voltage regulating step S4.

The voltage supplying step S2 includes supplying a third voltage VDD1 and a fourth voltage VDD2 to a second low dropout regulator 700a and supplying a first voltage VDDA to a first power network circuit 310 of a power network structure 300 and a first low dropout regulator 200a via the second low dropout regulator 700a.

The voltage regulating step S4 includes configuring the first low dropout regulator 200a to generate a second voltage VCSA according to the first voltage VDDA and adjust a first voltage difference between the first voltage VDDA of a first transmitting terminal T1 and the second voltage VCSA of a second transmitting terminal T2 according to the first reference voltage VREF1. In addition, the voltage regulating step S4 further includes configuring the second low dropout regulator 700a to adjust a second voltage difference between the third voltage VDD1 of a third transmitting terminal T3 and the first voltage VDDA of a fourth transmitting terminal T4 according to the second reference voltage VREF2 and the control signal EN, and adjust a third voltage difference between the fourth voltage VDD2 of a fifth transmitting terminal T5 and the first voltage VDDA of the fourth transmitting terminal T4 according to the control signal EN. In the voltage regulating step S4, the control signal EN is configured to turn on and off the second low dropout regulator 700a. In response to determining that the control signal EN is at a high voltage level, the second low dropout regulator 700a is turned on to enter a normal mode and adjusts the second voltage difference between the third voltage VDD1 of the third transmitting terminal T3 and the first voltage VDDA of the fourth transmitting terminal T4 according to the second reference voltage VREF2. On the contrary, in response to determining that the control signal EN is at a low voltage level, the second low dropout regulator 700a is turned off to enter a standby mode, and reduces the third voltage difference between the fourth voltage VDD2 of the fifth transmitting terminal T5 and the first voltage VDDA of the fourth transmitting terminal T4. In the specifications of the LPDDR4 memory, the standby mode includes a first standby mode IDD2P and a second standby mode IDD6S. Therefore, the management method 800 of the power management circuit 100a in the low-power double data rate memory of the present disclosure can utilize the control signal EN to switch the operation of the second low dropout regulator 700a in the standby mode and short circuit the first voltage VDDA and the fourth voltage VDD2, thus reducing the first voltage VDDA and the second voltage VCSA. In other words, the present disclosure can not only greatly save the power consumption of the third voltage VDD1, but also effectively reduce the leakage current of the circuit.

In other embodiments, the distance between the first connecting point and the second connecting point may be a straight line distance between the first connecting point and the second connecting point. The first unit network space may be a diagonal distance of a first unit grid of the first power network circuit. The second unit network space may be a diagonal distance of a second unit grid of the second power network circuit. The distance between the first connecting point and the second connecting point is smaller than or equal to one of the first unit network space and the second unit network space, but the present disclosure is not limited thereto.

According to the aforementioned embodiments and examples, the advantages of the present disclosure are described as follows.

1. The power management circuit in the low-power double data rate memory and the management method thereof of the present disclosure utilize the low dropout regulator combined with the power network structure and use the first voltage as an external power supply to generate the second voltage, so that the line width of the power supply only requires 4 um to solve the problem of the conventional technology (e.g., using the third voltage as the external power supply to generate the second voltage) that the line width of the power supply requires 22 um and is too large. In other words, the line width of the power supply can be saved by 81%.

2. The power management circuit in the low-power double data rate memory and the management method thereof of the present disclosure can utilize the control signal to switch the operation of the second low dropout regulator in the standby mode and short circuit the first voltage and the fourth voltage, thus reducing the first voltage and the second voltage. In other words, the present disclosure can not only greatly save the power consumption of the third voltage, but also effectively reduce the leakage current of the circuit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power management circuit in a low-power double data rate memory, which is configured to manage a plurality of power supplies of the low-power double data rate memory according to a reference voltage, the power management circuit in the low-power double data rate memory comprising:
   a low dropout regulator having a first transmitting terminal and a second transmitting terminal, wherein the first transmitting terminal is configured to transmit a first voltage of the power supplies, the second transmitting terminal is configured to transmit a second voltage of the power supplies, and the low dropout regulator adjusts a voltage difference between the first voltage and the second voltage according to the reference voltage; and
   a power network structure electrically connected to the low dropout regulator and comprising:
      a first power network circuit having a first connecting point electrically connected to the first transmitting terminal, wherein the first power network circuit has a grid shape and a first unit network space; and
      a second power network circuit having a second connecting point electrically connected to the second transmitting terminal, wherein the second power network circuit has another grid shape and a second unit network space, and the second connecting point is separated from the first connecting point by a distance;
   wherein the distance is smaller than or equal to one of the first unit network space and the second unit network space.

2. The power management circuit in the low-power double data rate memory of claim 1, wherein the low-power double data rate memory is a low-power double data rate 4 (LPDDR4) memory, the first voltage is equal to 1.35 V, and the second voltage is equal to 0.94 V.

3. The power management circuit in the low-power double data rate memory of claim 1, wherein the low dropout regulator and the power network structure are disposed in a chip, the chip is made of complementary metal oxide semiconductor (CMOS) and comprises a first metal layer and a second metal layer, and the first power network circuit and the second power network circuit are located in the first metal layer and the second metal layer, respectively.

4. The power management circuit in the low-power double data rate memory of claim 1, wherein the low dropout regulator comprises:
   a transistor electrically connected between the first transmitting terminal and the second transmitting terminal; and
   a comparator electrically connected to the first transmitting terminal, the second transmitting terminal and the transistor, wherein the comparator is configured to compare the reference voltage and the second voltage to generate a comparison signal, and the comparison signal is electrically connected to the transistor to adjust the voltage difference between the first voltage and the second voltage;
   wherein the transistor is a PMOS transistor and has a source electrode, a gate electrode and a drain electrode, and the source electrode, the gate electrode and the drain electrode are electrically connected to the first voltage, the comparison signal and the second voltage, respectively.

5. The power management circuit in the low-power double data rate memory of claim 1, further comprising:
   a storage unit comprising a bit line, a bit line bar and a storage capacitor;
   a voltage equalization circuit electrically connected to the bit line, the bit line bar and the first voltage, wherein the voltage equalization circuit is configured to equalize the bit line and the bit line bar according to the first voltage; and
   a sensing circuit electrically connected to the bit line, the bit line bar and the second voltage, wherein the sensing circuit is configured to sense a storage message of the storage capacitor according to the second voltage and transmit the storage message to one of the bit line and the bit line bar.

6. The power management circuit in the low-power double data rate memory of claim 1, wherein,
   the first power network circuit comprises:
      a plurality of first horizontal power lines arranged parallel to each other and extending in a first direction; and
      a plurality of first vertical power lines arranged parallel to each other and extending in a second direction, wherein each of the first vertical power lines is connected to each of the first horizontal power lines, and the second direction is perpendicular to the first direction;
   the second power network circuit comprises:
      a plurality of second horizontal power lines arranged parallel to each other and extending in the first direction; and
      a plurality of second vertical power lines arranged parallel to each other and extending in the second direction, wherein each of the second vertical power lines is connected to each of the second horizontal power lines; and
   the second connecting point is separated from the first connecting point by the distance along one of the first direction and the second direction.

7. A power management circuit in a low-power double data rate memory, which is configured to manage a plurality of power supplies of the low-power double data rate memory according to a first reference voltage, a second reference voltage and a control signal, the power management circuit in the low-power double data rate memory comprising:
   a first low dropout regulator having a first transmitting terminal and a second transmitting terminal, wherein the first transmitting terminal is configured to transmit a first voltage of the power supplies, the second transmitting terminal is configured to transmit a second voltage of the power supplies, and the first low dropout regulator adjusts a first voltage difference between the first voltage and the second voltage according to the first reference voltage;
   a second low dropout regulator having a third transmitting terminal, a fourth transmitting terminal and a fifth transmitting terminal, wherein the third transmitting terminal is configured to transmit a third voltage of the power supplies, the fourth transmitting terminal is configured to transmit the first voltage of the power supplies, the fifth transmitting terminal is configured to transmit a fourth voltage of the power supplies, and the second low dropout regulator adjusts a second voltage difference between the third voltage and the first voltage according to the second reference voltage and the control signal, and adjusts a third voltage difference between the fourth voltage and the first voltage according to the control signal; and
a power network structure electrically connected to the first low dropout regulator and the second low dropout regulator and having a unit network space, wherein the power network structure is electrically connected to the first transmitting terminal and the second transmitting terminal through a first connecting point and a second connecting point, the second connecting point is separated from the first connecting point by a distance, and the distance is smaller than or equal to the unit network space.

8. The power management circuit in the low-power double data rate memory of claim 7, wherein the power network structure comprises:
a first power network circuit having the first connecting point electrically connected to the first transmitting terminal, wherein the first power network circuit has a grid shape and a first unit network space; and
a second power network circuit having the second connecting point electrically connected to the second transmitting terminal, wherein the second power network circuit has another grid shape and a second unit network space;
wherein the unit network space is equal to one of the first unit network space and the second unit network space.

9. The power management circuit in the low-power double data rate memory of claim 8, wherein the first low dropout regulator, the second low dropout regulator and the power network structure are disposed in a chip, the chip is made of complementary metal oxide semiconductor (CMOS) and comprises a first metal layer and a second metal layer, and the first power network circuit and the second power network circuit are located in the first metal layer and the second metal layer, respectively.

10. The power management circuit in the low-power double data rate memory of claim 8, wherein,
the first power network circuit comprises:
a plurality of first horizontal power lines arranged parallel to each other and extending in a first direction; and
a plurality of first vertical power lines arranged parallel to each other and extending in a second direction, wherein each of the first vertical power lines is connected to each of the first horizontal power lines, and the second direction is perpendicular to the first direction;
the second power network circuit comprises:
a plurality of second horizontal power lines arranged parallel to each other and extending in the first direction; and
a plurality of second vertical power lines arranged parallel to each other and extending in the second direction, wherein each of the second vertical power lines is connected to each of the second horizontal power lines; and
the second connecting point is separated from the first connecting point by the distance along one of the first direction and the second direction.

11. The power management circuit in the low-power double data rate memory of claim 7, wherein the first low dropout regulator comprises:
a first transistor electrically connected between the first transmitting terminal and the second transmitting terminal; and
a first comparator electrically connected to the first transmitting terminal, the second transmitting terminal and the first transistor, wherein the first comparator is configured to compare the first reference voltage and the second voltage to generate a first comparison signal, and the first comparison signal is electrically connected to the first transistor to adjust the first voltage difference between the first voltage and the second voltage;
wherein the first transistor is a PMOS transistor and has a source electrode, a gate electrode and a drain electrode, and the source electrode, the gate electrode and the drain electrode are electrically connected to the first voltage, the first comparison signal and the second voltage, respectively.

12. The power management circuit in the low-power double data rate memory of claim 11, wherein the second low dropout regulator comprises:
a second transistor electrically connected between the third transmitting terminal and the fourth transmitting terminal;
a third transistor electrically connected between the fourth transmitting terminal and the fifth transmitting terminal and controlled by the control signal;
a second comparator electrically connected to the third transmitting terminal, the fourth transmitting terminal and the second transistor, wherein the second comparator is configured to compare the second reference voltage and the first voltage to generate a second comparison signal, and the second comparison signal is electrically connected to the second transistor to adjust the second voltage difference between the third voltage and the first voltage; and
a fourth transistor electrically connected to the second comparator and controlled by the control signal;
wherein each of the second transistor and the third transistor is the PMOS transistor, and the fourth transistor is an NMOS transistor.

13. The power management circuit in the low-power double data rate memory of claim 7, wherein the low-power double data rate memory is a low-power double data rate 4 (LPDDR4) memory, the first voltage is equal to 1.35 V, the second voltage is equal to 0.94 V, the third voltage is equal to 1.80 V, and the fourth voltage is equal to 1.10 V.

14. A management method of a power management circuit in a low-power double data rate memory, which is configured to manage a plurality of power supplies of the low-power double data rate memory according to a reference voltage, the management method of the power management circuit in the low-power double data rate memory comprising:
performing a voltage supplying step, wherein the voltage supplying step comprises supplying a first voltage to a first power network circuit of a power network structure and a low dropout regulator; and
performing a voltage regulating step, wherein the voltage regulating step comprises configuring the low dropout regulator to generate a second voltage according to the first voltage and adjust a first voltage difference between the first voltage of a first transmitting terminal and the second voltage of a second transmitting terminal according to the reference voltage;

wherein the low dropout regulator has the first transmitting terminal and the second transmitting terminal, the first transmitting terminal is configured to transmit the first voltage of the power supplies, the second transmitting terminal is configured to transmit the second voltage of the power supplies, the power network structure is electrically connected to the low dropout regulator and comprises the first power network circuit and a second power network circuit, the first power network circuit has a first connecting point electrically connected to the first transmitting terminal, the first power network circuit has a grid shape and a first unit network space, the second power network circuit has a second connecting point electrically connected to the second transmitting terminal, the second power network circuit has another grid shape and a second unit network space, the second connecting point is separated from the first connecting point by a distance, and the distance is smaller than or equal to one of the first unit network space and the second unit network space.

15. The management method of the power management circuit in the low-power double data rate memory of claim 14, wherein,
the voltage supplying step further comprises supplying a third voltage and a fourth voltage to another low dropout regulator;
the voltage regulating step further comprises configuring the another low dropout regulator to adjust a second voltage difference between the third voltage of a third transmitting terminal and the first voltage of a fourth transmitting terminal according to another reference voltage and a control signal, and adjust a third voltage difference between the fourth voltage of a fifth transmitting terminal and the first voltage of the fourth transmitting terminal according to the control signal; and
the another low dropout regulator has the third transmitting terminal, the fourth transmitting terminal and the fifth transmitting terminal, the third transmitting terminal is configured to transmit the third voltage of the power supplies, the fourth transmitting terminal is configured to transmit the first voltage of the power supplies, and the fifth transmitting terminal is configured to transmit the fourth voltage of the power supplies.

16. The management method of the power management circuit in the low-power double data rate memory of claim 15, wherein in the voltage regulating step, the control signal is configured to turn on and off the another low dropout regulator;
in response to determining that the control signal is at a high voltage level, the another low dropout regulator is turned on to enter a normal mode and adjusts the second voltage difference between the third voltage of the third transmitting terminal and the first voltage of the fourth transmitting terminal according to the another reference voltage; and
in response to determining that the control signal is at a low voltage level, the another low dropout regulator is turned off to enter a standby mode, and reduces the third voltage difference between the fourth voltage of the fifth transmitting terminal and the first voltage of the fourth transmitting terminal.

17. The management method of the power management circuit in the low-power double data rate memory of claim 15, wherein the another low dropout regulator comprises:
a second transistor electrically connected between the third transmitting terminal and the fourth transmitting terminal;
a third transistor electrically connected between the fourth transmitting terminal and the fifth transmitting terminal and controlled by the control signal;
a second comparator electrically connected to the third transmitting terminal, the fourth transmitting terminal and the second transistor, wherein the second comparator is configured to compare the another reference voltage and the first voltage to generate a second comparison signal, and the second comparison signal is electrically connected to the second transistor to adjust the second voltage difference between the third voltage and the first voltage; and
a fourth transistor electrically connected to the second comparator and controlled by the control signal;
wherein each of the second transistor and the third transistor is a PMOS transistor, and the fourth transistor is an NMOS transistor.

18. The management method of the power management circuit in the low-power double data rate memory of claim 15, wherein the low dropout regulator, the another low dropout regulator and the power network structure are disposed in a chip, the chip is made of complementary metal oxide semiconductor (CMOS) and comprises a first metal layer and a second metal layer, and the first power network circuit and the second power network circuit are located in the first metal layer and the second metal layer, respectively.

19. The management method of the power management circuit in the low-power double data rate memory claim 15, wherein the low-power double data rate memory is a low-power double data rate 4 (LPDDR4) memory, the first voltage is equal to 1.35 V, the second voltage is equal to 0.94 V, the third voltage is equal to 1.80 V, and the fourth voltage is equal to 1.10 V.

20. The management method of the power management circuit in the low-power double data rate memory claim of claim 14, wherein,
the first power network circuit comprises:
a plurality of first horizontal power lines arranged parallel to each other and extending in a first direction; and
a plurality of first vertical power lines arranged parallel to each other and extending in a second direction, wherein each of the first vertical power lines is connected to each of the first horizontal power lines, and the second direction is perpendicular to the first direction;
the second power network circuit comprises:
a plurality of second horizontal power lines arranged parallel to each other and extending in the first direction; and
a plurality of second vertical power lines arranged parallel to each other and extending in the second direction, wherein each of the second vertical power lines is connected to each of the second horizontal power lines; and
the second connecting point is separated from the first connecting point by the distance along one of the first direction and the second direction.

* * * * *